United States Patent
Yoshino (10) Patent No.: US 8,241,838 B2
(45) Date of Patent: Aug. 14, 2012

(54) METHOD OF MANUFACTURING SEMICONDUCTOR DEVICE

(75) Inventor: Hiroshi Yoshino, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 252 days.

(21) Appl. No.: 12/545,380

(22) Filed: Aug. 21, 2009

(65) Prior Publication Data
US 2010/0047720 A1  Feb. 25, 2010

(30) Foreign Application Priority Data

Aug. 25, 2008 (JP) ................. 2008-215328

(51) Int. Cl.
*G03F 7/26* (2006.01)
(52) U.S. Cl. .......... 430/314; 430/394; 430/315
(58) Field of Classification Search .......... 430/312, 430/394, 315, 323, 313, 314
See application file for complete search history.

(56) References Cited

U.S. PATENT DOCUMENTS 6,664,028 B2 * 12/2003 Hwang et al. ............. 430/312
2008/0032508 A1 * 2/2008 Chang ...................... 438/725

FOREIGN PATENT DOCUMENTS

JP  05-343279  12/1993

OTHER PUBLICATIONS

Hiroko Nakamura et al. (2007). "Ultra-low $k_1$ oxide contact hole formation and metal filling using resist contact hole pattern by Double L&S Formation Method," Proc. of SPIE 6520.:E-1 to E-10.

* cited by examiner

*Primary Examiner* — Kathleen Duda
*Assistant Examiner* — Caleen Sullivan
(74) *Attorney, Agent, or Firm* — Morrison & Foerster LLP (57) ABSTRACT

A method of manufacturing a semiconductor device includes the following processes. A first resist layer covering an etching object is patterned to form a first resist pattern. Then, a filling layer that covers the first resist pattern and has a flat upper surface is formed. Then, a second resist layer covering the flat upper surface is patterned to from a second resist pattern.

19 Claims, 5 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device.

Priority is claimed on Japanese Patent Application No. 2008-215328, filed Aug. 25, 2008, the content of which is incorporated herein by reference.

2. Description of the Related Art

With further miniaturization of semiconductor devices, miniaturized resist patterns smaller than a wavelength limit of an exposure wavelength have been formed by lithography using a conventional exposure. As a method of forming such a pattern smaller than the wavelength limit, a method using oblique illumination such as annular illumination or dipole illumination, which is called a super resolution technology, and a method using a phase shift mask are well known.

Additionally, double patterning has been considered as a method of further miniaturizing a resist pattern. Particularly, a dense contact hole formation has more difficulty in enhancing the resolution than a line-and-space pattern formation, thereby requiring a double patterning method.

The first embodiment of Japanese Patent, Laid-Open Publication No. H05-343279 discloses a double patterning method in which a second resist film is formed over a first resist film after the first resist film is patterned, and then a second exposure is carried out to form an opening that is defined by the first and second resist films and is smaller than the wavelength limit.

On the other hand, Nakamura et al. "Ultra-low k1 oxide contact hole formation and filling using resist contact hole pattern by double L&S formation method" SPIE 6520 (2007) 1E-1 discloses a method of forming a contact hole pattern using double patterning. Specifically, in this method, a first resist pattern is formed and then cured, the second resist pattern is formed over the first resist pattern, and then a hole is formed with the first and second resist patterns as masks.

However, in both the related arts, a second resist film is deposited directly on the first resist pattern, and then the second resist pattern is formed by exposure and developing. For this reason, steps defined by the first resist pattern cause a degradation in the shape of the second resist pattern. Additionally, unless a focus depth of the exposure apparatus such as a stepper is much larger than the depths of the steps of the first resist pattern, it causes a degradation in the resolution upon an exposure of the second resist film.

SUMMARY

In one embodiment, there is provided a method of manufacturing a semiconductor device which includes the following processes. A first resist layer covering an etching object is patterned to form a first resist pattern. Then, a filling layer that covers the first resist pattern and has a flat upper surface is formed. Then, a second resist layer covering the flat upper surface is patterned to form a second resist pattern.

Accordingly, the second resist pattern can be formed with a minute and precise shape since the upper surface of the filling layer is flat when the second layer is exposed. Therefore, a minute pattern can be formed in the etching object with high precision.

BRIEF DESCRIPTION OF THE DRAWINGS

The above features and advantages of the present invention will be more apparent from the following description of certain preferred embodiments taken in conjunction with the accompanying drawings, in which.

FIGS. 2A to 5A and FIGS. 2B to 5B are, respectively, perspective and plane views indicative of a process flow illustrating a method of forming dense contact holes according to the first embodiment; and FIGS. 6A to 9A and FIGS. 6B to 9B are, respectively, perspective and plane views indicative of a process flow illustrating a method of forming dense contact holes according to a second embodiment.

DETAILED DESCRIPTION OF THE PREFERRED EMBODIMENTS

The present invention will now be described herein with reference to illustrative embodiments. The accompanying drawings explain a method of manufacturing a semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the invention is not limited to the embodiments illustrated herein for explanatory purposes.

First Embodiment

Figure 1:
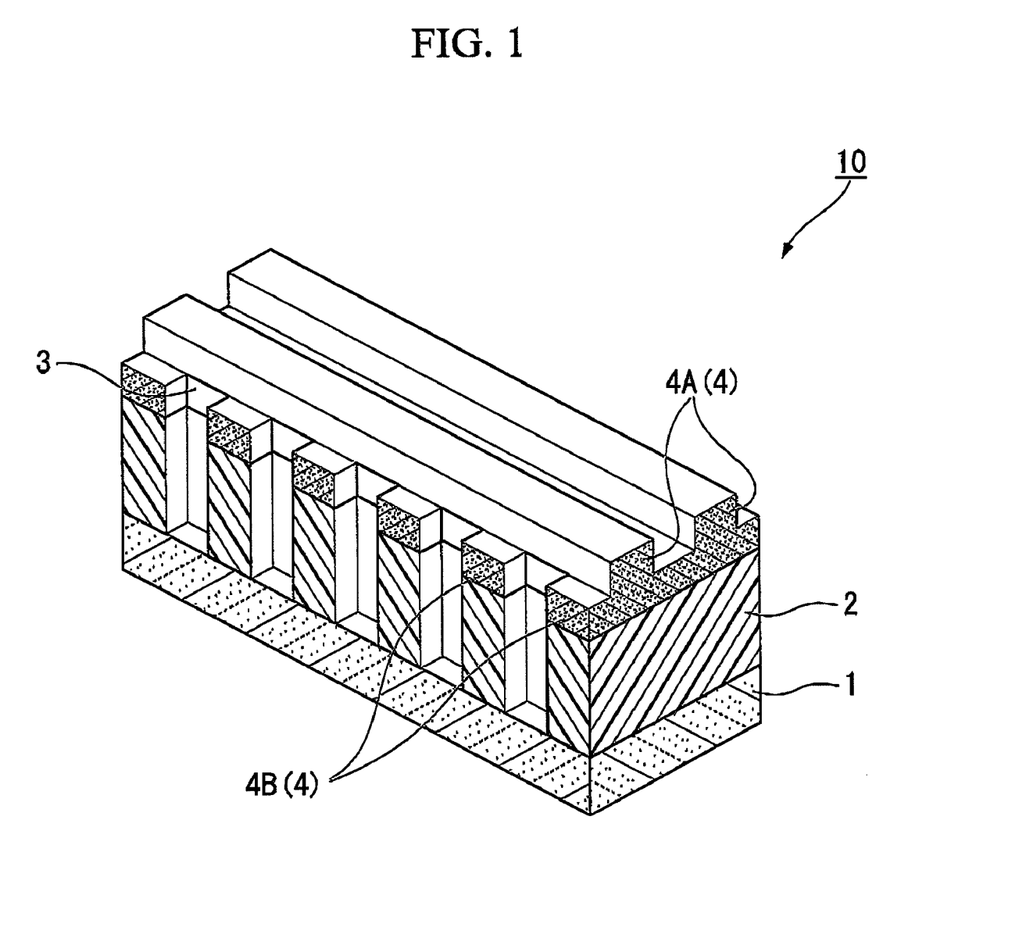
FIG. 1 is a perspective view illustrating a mask to be used for forming contact holes according to a first embodiment of the present invention.

A first embodiment of the present invention explains a case where the present invention is applied when dense contact holes are formed in an etching object such as a silicon substrate or an insulating layer disposed on a semiconductor substrate. FIG. 1 is a perspective view illustrating a mask 10 used for forming contact holes according to the first embodiment.

The mask 10 is deposited on an etching object (1). In this embodiment, the etching object (1) is a semiconductor substrate 1 to form multiple dense contact holes in the semiconductor substrate 1 to be processed. The mask 10 includes a contact hole pattern including multiple openings, through which the semiconductor substrate 1 is etched to form contact holes. Specifically, the mask 10 includes: an organic lower layer 2 that is formed on the semiconductor substrate 1 and has the contact hole pattern; a first resist pattern 3 that is formed on the organic lower film 2 and extends in a first direction; and a filling layer 4 including a space pattern 4B extending in the first direction and a replica pattern 4A extending in a second direction perpendicular to the first direction which are deposited in this order on the organic lower layer 2.

The semiconductor substrate 1 as the etching object may be, but is not limited to, a silicon substrate. Additionally, the etching object (1) may be single-layered or multi-layered insulating film on the semiconductor substrate (for example, a silicon oxide film or a silicon nitride film as the insulating film). If the insulating layer is single-layered, contact holes may be formed in the insulating layer by using the mask 10 so as to have a certain depth or to penetrate the insulating layer. If the insulating layer is multi-layered, contact holes may be formed down to a level of an upper surface of a certain layer.

The organic lower layer 2 is formed to serve as a mask for etching the semiconductor substrate 1, and may be made of, for example, an organic spin coating material containing a novolac resin as a main component.

Preferably, the organic lower layer 2 is as thin as possible while having the sufficient etching resistance when the semiconductor substrate 1 is etched. If the organic lower layer 2 is too thin to have the sufficient etching resistance, the shape of the mask pattern degrades when the organic lower layer 2 is etched. Similarly, if the organic lower layer 2 is thicker than necessary, the shape of the mask pattern degrades when the organic lower layer 2 is etched. For example, if 500 nm of an oxide film of the semiconductor substrate 1 is to be processed, the thickness of the organic lower layer 2 is preferably in a range of 200 nm to 400 nm.

The first resist pattern 3 (first resist layer) and a second resist pattern 5 (second resist layer) which will be explained later may be made of a chemically-amplified resist to be used for ArF excimer laser exposure, but is not limited thereto. A resist suitable to an exposing source for exposing the first and second resist layers can be appropriately selected. The first and second resist layers may be the same resist layer or different resist layers.

The filling layer 4 may be made of any material as long as the filling layer 4 can fill the openings of the first resist pattern 3 and an upper surface of the first resist pattern 3 can be planarized. Preferably, a material forming the filling layer 4 has an etching selectivity different from that of the material forming the first and second resist patterns 3 and 5. Specifically, if the first and second resist patterns are made of resin, the filling layer 4 is preferably a layer including silicon. More preferably, the layer including silicon includes an SOG (Spin On Glass) film made of, for example, silanol $(Si(OH)_4)$.

Hereinafter, a method of forming dense contact holes in a silicon substrate according to the first embodiment is explained with reference to FIGS. 2 to 5. FIGS. 2A to 5A are perspective views indicative of a process flow illustrating the method. FIGS. 2B to 5B are plane views.

The method of forming contact holes according to the first embodiment includes: forming an organic lower layer on a semiconductor substrate; forming a first resist pattern by patterning a first resist layer after the first resist layer is formed on the organic lower layer; forming a filling layer that fills openings of the first resist pattern and has a flat upper surface; patterning a second resist layer formed on the flat surface of the filling layer to form a second resist pattern; etching, down to the upper surface of the first resist pattern, the filling layer using the second resist pattern as a mask; etching the first resist pattern uncovered by the second resist pattern using the filling layer as a mask; patterning the organic lower layer using the filling layer exposed after the first and second resist patterns are removed as a mask; and etching the semiconductor substrate using the filling layer (and the organic lower layer) as a mask.

Figure 2A:
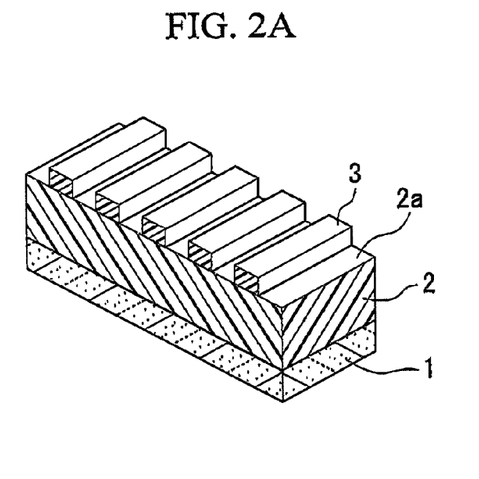
Figure 2B:
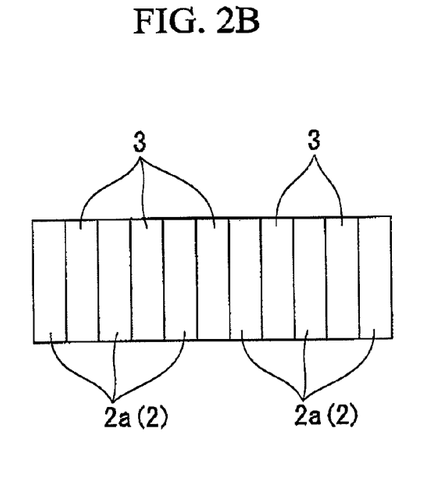

Specifically, an organic lower layer 2 containing a novolac resin as a main component is formed on the semiconductor substrate (silicon substrate) 1, as shown in FIGS. 2A and 2B. The organic lower layer 2 is formed by, for example, spin-coating an organic material containing a novolac resin as a main component and then carrying out a baking process.

Then, a chemically-amplified resist to be used for ArF excimer laser exposure is formed over an upper surface 2a of the organic lower layer 2 to form the first resist layer. Then, a line-and-space pattern extending in a first direction is exposed by an ArF excimer laser exposure apparatus. Then, a baking is carried out after the exposure, and then first resist layer is developed by an alkali developer. By patterning the first resist layer in this manner, the first resist pattern 3 including multiple line patterns that are aligned at a given interval and extend in the first direction are formed, as shown in FIGS. 2A and 2B.

Since the organic lower layer 2 is formed between the silicon substrate 1 and the first resist layer in the first embodiment, the upper surface of the organic lower layer 2 can be flat even if the upper surface of the semiconductor substrate 1 is not flat. Thus, a resolution of the first resist pattern can be enhanced. A material for preventing reflection may be used as the organic lower layer 2 in order to prevent a reflection from the semiconductor substrate 1 and therefore to improve the resolution.

Then, the first resist pattern 3 is cured using ultraviolet light, and an SOG film made of silanol is spin-coated. In this cases the thickness of the SOG film is determined such that the SOG film fills the space portions of the line-and-space pattern of the first resist pattern 3 and also covers the first resist pattern 3.

Figure 3A:
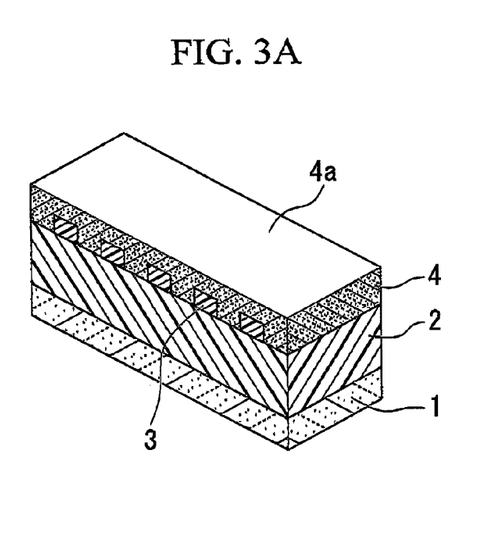
Figure 3B:
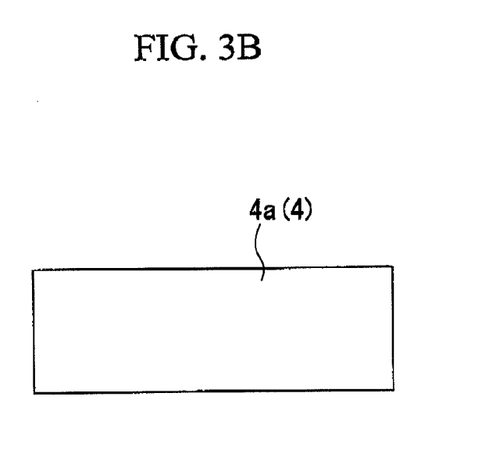

Then, a thermal treatment is carried out at, for example, 200 to 350° C. to form the filling layer 4 made of the SOG film having a thickness nearly equal to 200 nm, as shown in FIGS. 3A and 3B. By the SOG film being used for the filling layer 4 in this manner, the filling layer 4 can easily fill the openings of the first resist pattern 3 and cover the first resist pattern 3, and the flat upper surface 4a of the filling layer 4 can be easily made.

Figure 4A:
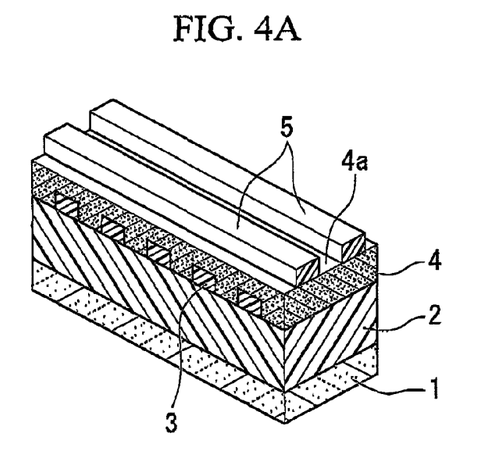
Figure 4B:
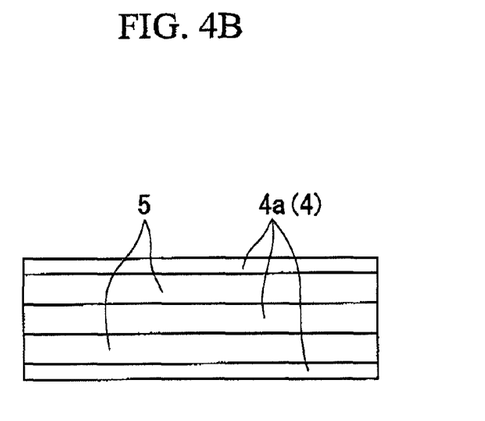

Then, a chemically-amplified resist to be used for ArF excimer laser exposure is formed over the flat surface 4a of the filling layer 4 to form the second resist layer. Then, a line-and-space pattern extending in a second direction perpendicular to the first direction is exposed by an ArF excimer laser exposure apparatus. Then, a baking is carried out after the exposure, and the second resist layer is developed by an alkali developer. By patterning the second resist layer in this manner, the second resist pattern 5 including multiple line patterns that are aligned at a given interval and extend in the second direction is formed as shown in FIGS. 4A and 4B.

Since the second resist layer is formed on the flat surface 4a of the filling layer 4 in the first embodiment, the miniaturized second resist pattern 5 which is nearly equal to the resolution limit of the exposure apparatus can be formed when the second resist layer is exposed. Accordingly, the shape of the second resist pattern 5 does not degrade due to the steps of the first resist pattern 3.

Figures 5A, 5B:
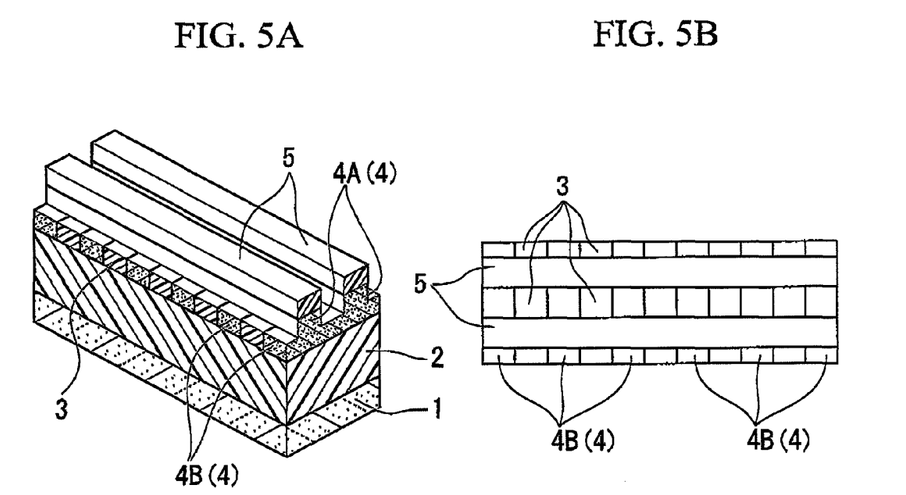
Figure 6A:
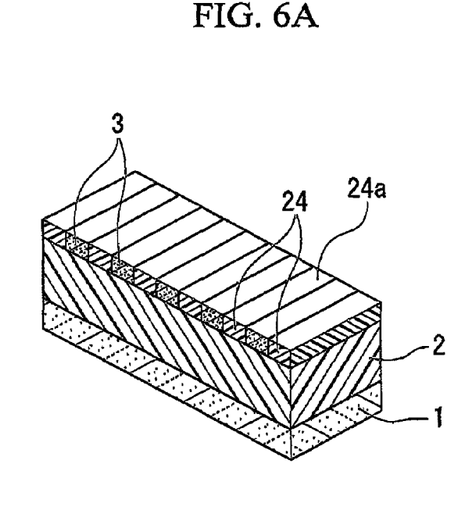
Figure 6B:
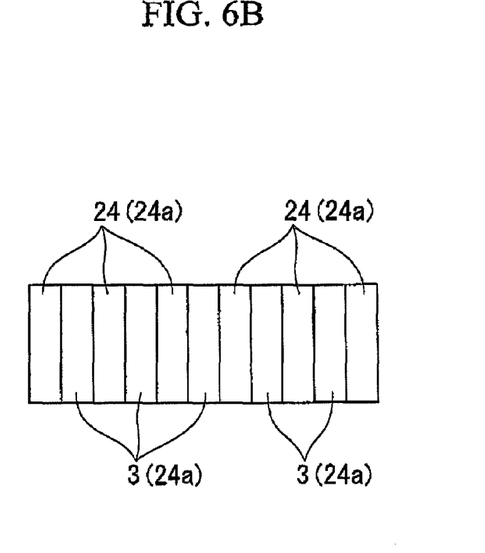

Then, the filling layer 4 uncovered by the second resist pattern 5 is dry-etched by a dry-etching apparatus by using the second resist pattern 5 as a mask, down to a level of the upper surface of the first resist pattern 3, as shown in FIG. 5A. The etching of the filling layer 4 is carried out using $CF_4$ gas for 30 seconds at an energy of 450 W.

The filling layer 4 includes the SOG film including silicon, and has an etching selectivity with respect to the second resist pattern 5. The etching rate of the filling layer 4 is much higher than that of the second resist pattern 5 according to the etching condition of the filling layer 4. Therefore, the second resist pattern 5 can be used as a mask.

By the etching, a replica pattern 4A of the second resist pattern 5 is formed immediately below the second resist pattern 5. A space pattern 4B including the SOG film is filled in the openings of the first resist pattern 3 (i.e., the space portions of the line-and-space pattern). Thus, the first resist pattern 3 and the space pattern 4B which are alternately aligned become uncovered by the second resist pattern 5.

Then, the first resist pattern 3 uncovered by the second resist pattern 5 is selectively etched using a dry etching apparatus while the filling layer 4 (space pattern 4B) remains. The dry etching condition by which only the first resist pattern can be removed is used. Since the filling layer 4 has an etching selectivity to the first resist pattern 3, only the first resist pattern 3 uncovered by the second resist pattern 5 can be selectively etched. When the first resist pattern 3 is etched, the second resist pattern 5 is completely removed in some cases, and is not completely removed in other cases. Even if the second resist pattern 5 is completely etched during the etching of the first resist pattern 3, the replica pattern 4A that is formed immediately below the second resist pattern 5 and includes the SOG film serves as a mask. For this reason, the first resist pattern 3 under the replica pattern 4A is not excessively etched.

After the etching of the first resist pattern 3, the organic lower layer 2 is dry-etched. The dry etching of the organic lower layer 2 is carried out using oxygen ($O_2$) gas and nitrogen ($N_2$) gas at an energy of 450 W for 60 seconds. The etching of the first resist pattern 3 and the etching of the organic lower layer 2 may be separately or sequentially carried out. When the organic lower layer 2 is etched, the second resist pattern 5 is completely removed.

Thus, a mask made of the filling layer 4 including the replica pattern 4A and the space pattern 4B which are deposited in a grid is formed as a contact hole pattern. Then, the organic lower layer 2 is etched using the contact hole pattern as a mask down to the level of the upper surface of the semiconductor substrate 1. Thus, the mask 10 having multiple contact holes as shown in FIG. 1 is formed.

Then, the semiconductor substrate 1 is etched using the mask 10 (including the filling layer 4 and the patterned organic lower layer 2). A condition by which the silicon substrate can be etched is used as the etching condition. Thus, dense contact holes can be formed in the silicon substrate.

As explained above, according to the method of manufacturing the semiconductor device of the first embodiment, the filling layer 4 which fills the openings of the first resist pattern 3 and covers the first resist pattern 3 and whose upper surface is the flat surface 4a is formed, and then the second resist layer is formed on the flat surface 4a. For this reason, there is no step when the second resist layer is exposed. Therefore, the second resist pattern 5 having a minute and adequate shape can be formed.

Additionally, the first and second resist patterns 3 and 5 are made as line-and-space patterns in a grid such that the first resist pattern 3 extends in the first direction and the second resist pattern 5 extends in the second direction perpendicular to the first direction. Accordingly, openings of the grid pattern having the size exceeding the resolution limit of the exposure apparatus can be formed. Additionally, multiple dense contact holes can be collectively formed using the openings of the grid pattern as a contact hole pattern.

Further, the filling layer 4 uncovered by the second resist pattern 5 is etched down to the level of the upper surface of the first resist pattern 3 using the second resist pattern 5 as a mask. Then, the first resist pattern 3 uncovered by the second resist pattern 5 is etched. Thus, the replica pattern 4A and the space pattern 4B corresponding to openings of the first resist pattern 3 can be formed. Accordingly, the filling layer 4 uncovered after the first and second resist patterns 3 and 5 are removed can be used as a mask.

Moreover, the filling layer 4 includes the SOG film including silicon, and therefore the filling layer 4 has an etching selectivity to the first and second resist patterns 3 and 5. Accordingly, the filling layer 4 and the first and second resist patterns 3 and 5 can be selectively etched by appropriately selecting the etching condition.

Additionally, the organic lower layer 2 is formed on the semiconductor substrate 1 including a silicon substrate. Therefore, a film layer similar to that in the case of using the conventional resist mask can be processed with high precision. Then, the replica pattern 4A and the space pattern 4B both including the SOG film are formed using the first and second resist patterns 3 and 5. Using the filling layer 4 including the replica pattern 4A and the space pattern 4B as a mask, minute contact hole pattern can be formed in the organic lower layer 2. Then, the silicon substrate can be etched using the organic lower layer 2 having a flat surface as a mask.

Second Embodiment

Hereinafter, a second embodiment of the present invention is explained.

In the second embodiment, the present invention is applied when a dense dot pattern (island pattern) is formed on a silicon substrate. A method of forming a dot pattern in the second embodiment is different from the method of forming a contact hole in the first embodiment. Hereinafter, a method of forming a dot pattern is explained with reference to FIGS. 6 to 9. Like reference numerals denote like elements between the first and second embodiments, and explanations thereof are omitted.

In the method of forming a dot pattern according to the second embodiment, an SOG film that fills openings of the first resist pattern 3 and covers the first resist pattern 3 is formed as shown in FIGS. 3A and 3B. Then, the SOG film is etched back until the upper surface of the first resist pattern 3 is exposed. In other words, a filling layer 24 is formed such that upper surfaces of the filling layer 24 and the first resist pattern 3 form a flat surface 24a. The filling layer 24 has a shape corresponding to openings of the first resist pattern 3 (i.e., the space portions of the line-and-space pattern).

Figure 7A:
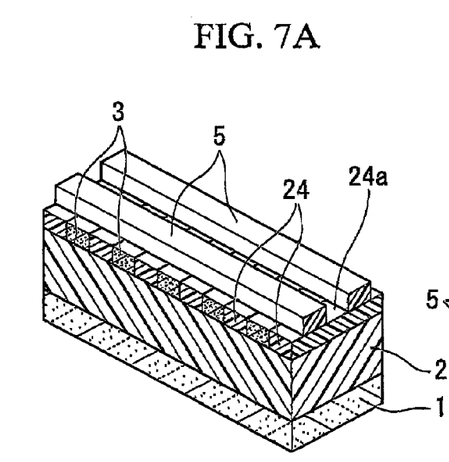
Figure 7B:
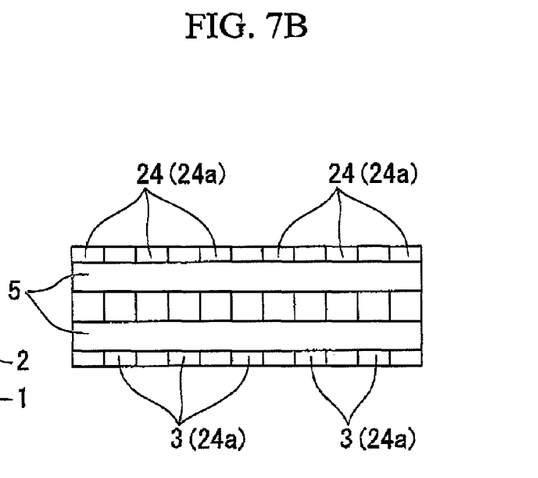

Then, the second resist pattern 5 is formed on the flat surface 24a of the filling layer 24 in a similar manner to the first embodiment, as shown in FIGS. 7A and 7B.

Since the second resist layer is formed on the flat surface 24a of the filling layer 24 in the second embodiment, the second resist pattern 5 which is smaller than the resolution limit of an exposure apparatus can be formed similarly to the first embodiment.

Since the SOG film is etched down to the level of the upper surface of the first resist pattern 3, the first resist pattern 3 and the filling layer 24 which are alternately placed become uncovered by the second resist pattern 5.

Figure 8A:
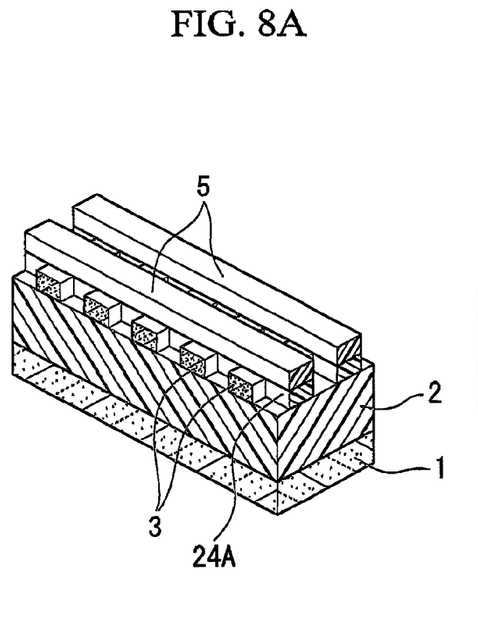
Figure 8B:
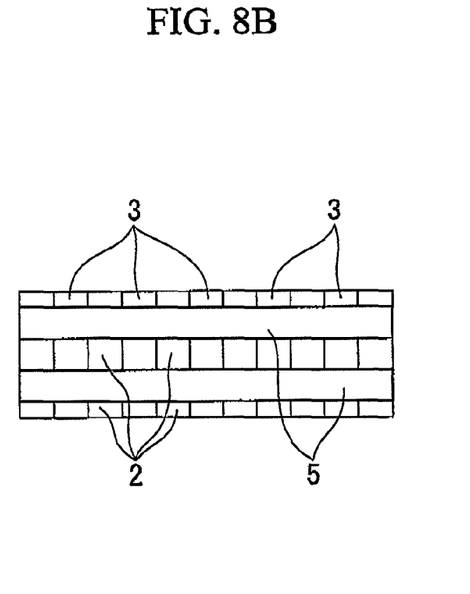

Then, the filling layer 24 uncovered by the second resist pattern 5 is etched using the first and second resist patterns 3 and 5 as masks, as shown in FIGS. 8A and 8B. In the second embodiment, the replica pattern 4A of the second resist pattern 5 is not formed as in the first embodiment, and a dot pattern 24A formed by the filling layer 24 is formed immediately below the second resist pattern 5. The etching condition is preferably a condition by which the filling layer 24 can be selectively etched.

Then, the etching condition is changed so that the first and second resist patterns 3 and 5 and the organic lower layer 2 are independently or sequentially etched to be removed.

Figure 9A:
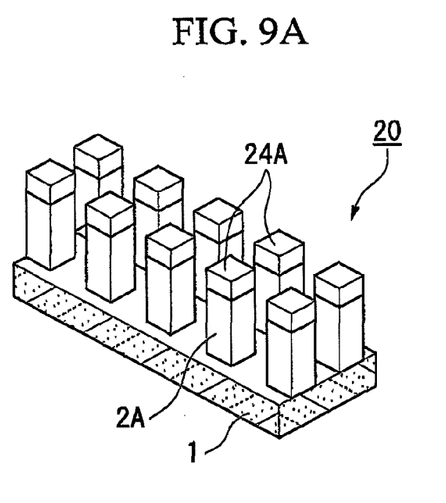
Figure 9B:
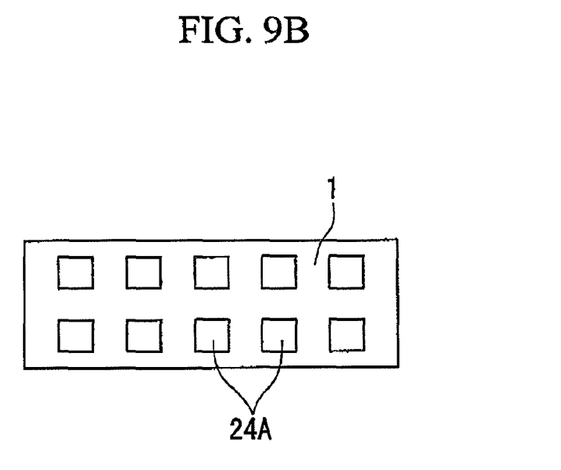

In this manner, a mask 20 can be formed on the semiconductor substrate 1, which includes a dense pillar pattern including the dot pattern 24 including the filling layer 24 and the organic lower layer 2A having the same shape as that of the dot pattern, as shown in FIG. 9A. Additionally, the semiconductor substrate 1 uncovered by the dot pattern 24 is etched to form a dense dot pattern in the silicon substrate, as shown in FIG. 9B.

As explained above, according to the method of manufacturing the semiconductor device of the second embodiment, a minute dot pattern can be formed in the silicon substrate with high dimensional precision.

Additionally, a dry etching process after the second resist pattern 5 is formed can be omitted by forming the filling layer 24 such that the upper layers of the filling layer 24 and the first resist pattern 3 form the flat surface 24*a*.

Further, since the level difference between the first and second resist patterns 3 and 5 is smaller than that in the first embodiment, the first and second patterns 3 and 5 can be suitably used as masks when the filling layer 24 uncovered by the second resist pattern 5 is etched.

It is apparent that the present invention is not limited to the above embodiments, but may be modified and changed without departing from the scope and spirit of the invention.

For example, although it has been explained in the first and second embodiments that both the first and second resist patterns 3 and 5 are line-and-space patterns, the present invention can be applied to a combination of other resist patterns.

Although it has been explained in the first and second embodiments that the extending direction of the line-and-space pattern of the first resist pattern 3 is perpendicular to the extending direction of the line-and-space pattern of the second resist pattern 5, the present invention can be applied to the case where the two extending directions are not perpendicular to each other.

Although the first resist pattern 3 uncovered by the second resist pattern 5 is etched in the first embodiment, the space pattern 4B (filling layer 4) including the SOG film may be etched. Additionally, the first resist pattern uncovered by the second resist pattern 5 may be etched in the second embodiment.

Although the organic lower layer 2 is provided between the semiconductor substrate 1 and the first resist film in the first and second embodiments, the first resist layer may be directly formed on the semiconductor substrate 1. Moreover, although a reflection preventing film is not used when the first and second patterns 3 and 5 are patterned in the first and second embodiments, a patterning can be carried out with higher precision by using a reflection preventing film.

As used herein, the following directional terms "forward, rearward, above, downward, vertical, horizontal, below, and transverse" as well as any other similar directional terms refer to those directions of a semiconductor device manufactured by the method of the present invention. Accordingly, these terms, as utilized to describe the present invention should be interpreted relative to a semiconductor device manufactured by the method of the present invention.

What is claimed is:

1. A method of manufacturing a semiconductor device, comprising:
    patterning a first resist layer covering an etching object to form a first resist pattern;
    forming a filling layer that covers the first resist pattern and has a flat upper surface;
    patterning a second resist layer covering the flat upper surface to form a second resist pattern; and
    etching the filling layer by using the second resist pattern as a mask until an upper surface of the first resist pattern is exposed so that the filling layer uncovered with the second resist pattern remains in a space of the first resist pattern.

2. The method ac cording to claim 1, wherein the first resist pattern includes a plurality of first line patterns being located in parallel with each other, and the second resist pattern includes a plurality of second line patterns being located in parallel with each other.

3. The method ac cording to claim 2, wherein the first line pattern extends in a first direction, the second line pattern extends in a second direction, and the first direction is different from the second direction.

4. The method according to claim 1, further comprising:
    after etching the filling layer, etching the first resist pattern being performed by selective etching to have the filling layer remain; and
    etching the etching object by using the filling layer remaining as a mask.

5. The method according to claim 4, wherein the filling layer has an etching selectivity with respect to the first and second resist patterns.

6. The method according to claim 1, wherein forming the filling layer comprises:
    forming a thermosetting layer; and
    performing a thermal treatment on the thermosetting layer at a temperature of 200° C. to 350° C.

7. The method according to claim 6, wherein the thermosetting layer contains silicon.

8. The method according to claim 6, wherein the thermosetting layer is an SOG film.

9. The method according to claim 1, further comprising:
    before forming the filling layer, forming an organic lower layer between the etching object and the first resist layer.

10. The method according to claim 9, wherein the organic layer has a flat upper surface.

11. The method according to claim 9, further comprising:
    after etching the filling layer, etching the first resist pattern being performed by selective etching to have the filling layer remain;
    etching the organic layer and the second resist pattern by using the filling layer remaining as a mask; and
    etching the etching object by using the filling layer remaining as a mask.

12. The method according to claim 1, wherein the etching object comprises an insulating layer disposed on a semiconductor substrate.

13. A method of manufacturing a semiconductor device, comprising:
    patterning a first resist layer covering an etching object to form a first resist pattern;
    forming a filling layer that covers the first resist pattern and has a flat upper surface;
    performing a first etching of the filling layer until an upper surface of the first resist pattern is exposed;
    patterning a second resist layer covering the flat upper surface to form a second resist pattern; and
    performing a second etching of the filling layer by using the second resist pattern as a mask until the etching object is exposed while having the first resist pattern remain,
    wherein in the first etching of the filling layer, etching the filling layer is performed such that upper surface of the filling layer and the first resist pattern form a flat surface, and a level of the upper surface of the filling layer and a level of the upper surface of the first resist pattern are same.

14. The method according to claim 13, wherein the first resist pattern includes a plurality of first line patterns being located in parallel with each other, and the second resist pattern includes a plurality of second line patterns being located in parallel with each other.

15. The method according to claim 14, wherein the first line pattern extends in a first direction, the second line pattern extends in a second direction, and the first direction is different from the second direction.

16. The method according to claim 13, further comprising:
etching the first and second resist pattern while having the filling layer remain; and
etching the etching object by using the filling layer remaining as a mask.

17. The method according to claim 13, further comprising;
before forming the filling layer, forming on organic lower layer between the etching object and the first resist layer.

18. The method according to claim 17, wherein the organic layer has a flat upper surface.

19. The method according to claim 17, further comprising:
etching the first and second resist pattern while having the filling layer remain;
etching the first and second resist patterns and the organic layer while the filling layer and the organic layer that is covered by the filling layer remain; and
etching the etching object by using the filling layer and the organic layer that is covered by the filling layer as masks.

* * * * *